(12) United States Patent
Lee et al.

(10) Patent No.: US 12,112,666 B2
(45) Date of Patent: *Oct. 8, 2024

(54) DISPLAY DEVICE

(71) Applicant: Samsung Display Co., LTD., Yongin-si (KR)

(72) Inventors: Hae-Yeon Lee, Yongin-si (KR); Sukyoung Kim, Yongin-si (KR); Hwayoung Song, Yongin-si (KR); Kwangsae Lee, Yongin-si (KR); Il-Joo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/228,244

(22) Filed: Jul. 31, 2023

(65) Prior Publication Data

US 2024/0185750 A1 Jun. 6, 2024

(30) Foreign Application Priority Data

Dec. 1, 2022 (KR) .......................... 10-2022-0165896

(51) Int. Cl.
  *G09G 3/00* (2006.01)
  *G06F 3/041* (2006.01)
  (Continued)

(52) U.S. Cl.
  CPC ........... *G09G 3/006* (2013.01); *G06F 3/0412* (2013.01); *G06F 3/0443* (2019.05); *G09G 3/035* (2020.08);
  (Continued)

(58) Field of Classification Search
  CPC .................. G09G 3/006; G09G 3/035; G09G 2300/0426; G09G 2330/12; H10K 59/131;
  (Continued)

(56) References Cited

U.S. PATENT DOCUMENTS 11,513,622 B2 * 11/2022 Choi ...................... G06F 3/0446
11,907,457 B2 * 2/2024 Choi ...................... G06F 3/0448
(Continued)

FOREIGN PATENT DOCUMENTS

KR         100766946 B1    10/2007
KR     1020160060237 A      5/2016
(Continued)

*Primary Examiner* — Doon Y Chow
(74) *Attorney, Agent, or Firm* — CANTOR COLBURN LLP

(57) ABSTRACT

A display device includes: a substrate including a display area, a peripheral area surrounding the display area, a hole area positioned inside the display area, and a pad area; a crack detection line including a first part in the pad area and extending to the peripheral area and a second part connected to the first part, disposed to surround the hole area, and extending to the pad area; a printed circuit board in the pad area; first transistors in the pad area and connected in series between the printed circuit board and the first part, where each of gate electrodes of the first transistors is connected to a first signal line; and second transistors in the pad area and connected in series between a constant voltage line and the first part, where each of gate electrodes of the second transistors is connected to a second signal line.

20 Claims, 9 Drawing Sheets

(51) Int. Cl.
  *G06F 3/044*    (2006.01)
  *H10K 59/131*   (2023.01)
  *H10K 59/40*    (2023.01)
  *H10K 102/00*   (2023.01)

(52) U.S. Cl.
  CPC ........... *H10K 59/131* (2023.02); *H10K 59/40* (2023.02); *G06F 2203/04102* (2013.01); *G06F 2203/04111* (2013.01); *G09G 2300/0408* (2013.01); *G09G 2300/0426* (2013.01); *G09G 2330/12* (2013.01); *G09G 2354/00* (2013.01); *H10K 2102/311* (2023.02)

(58) Field of Classification Search
  CPC . H10K 59/40; H10K 2102/311; G06F 3/0412
  See application file for complete search history.

(56) References Cited

U.S. PATENT DOCUMENTS

| | | | |
|---|---|---|---|
| 2020/0173949 A1* | 6/2020 | Lee | G06F 3/04164 |
| 2020/0175900 A1* | 6/2020 | Han | H10K 71/70 |
| 2020/0175901 A1* | 6/2020 | Lee | G09G 3/006 |
| 2023/0368709 A1* | 11/2023 | Jung | G09G 3/3233 |

FOREIGN PATENT DOCUMENTS

| | | |
|---|---|---|
| KR | 1020200101555 A | 8/2020 |
| KR | 1020210083610 A | 7/2021 |

* cited by examiner

DL:DL-1,DL-2

DISPLAY DEVICE

This application claims priority to Korean Patent Application No. 10-2022-0165896, filed on Dec. 1, 2022, and all the benefits accruing therefrom under 35 USC § 119, the content of which in its entirety is herein incorporated by reference.

BACKGROUND

1. Field

Embodiments provide generally to display device. More particularly, embodiments relate to a display device providing visual information.

2. Description of the Related Art

With the development of information technology, the importance of a display device, which is a connection medium between a user and information, has been highlighted. For example, the use of the display device such as liquid crystal display device ("LCD"), organic light emitting display device ("OLED"), plasma display panel device ("PDP"), quantum dot display device or the like is increasing.

When the display device is subjected to an impact, crack may occur in a substrate or in a layer stacked on the substrate. The crack may become larger over time or spread to another layer or other area, which may cause a defect in the display device. For example, a signal line such as a data line or a gate line may be disconnected or resistance of the signal line may be increased due to a crack, thereby reducing element reliability. Accordingly, various problems such as non-emission of light or erroneous light emission of pixels of the display device may occur.

SUMMARY

Embodiments provide a display device capable of inspecting a crack of a hole formed in a hole area.

A display device according to an embodiment of the present disclosure includes: a substrate including a display area on which a plurality of pixels are disposed, a peripheral area surrounding the display area, a hole area positioned inside the display area, a pad area, and a bending area positioned between the peripheral area and the pad area in a plan view: a crack detection line including a first part disposed on the substrate in the pad area and extending to the bending area and the peripheral area and a second part connected to the first part, disposed to surround the hole area, and extending to the peripheral area, the bending area and the pad area: a printed circuit board disposed on the substrate in the pad area: a plurality of first transistors disposed on the substrate in the pad area and connected in series between the printed circuit board and the first part of the crack detection line, where each of gate electrodes of the first transistors is connected to a first signal line to receive a first signal: and a plurality of second transistors disposed on the substrate in the pad area and connected in series between a constant voltage line for applying a constant voltage and the first part of the crack detection line, where each of gate electrodes of the second transistors is connected to a second signal line to receive a second signal.

In an embodiment, the display device may further include a driving chip disposed on the substrate in the pad area. The driving chip may be connected to each of the first signal line and the second signal line, configured to provide the first signal to the first signal line, and configured to provide the second signal to the second signal line.

In an embodiment, when the display device is driven in an inspection mode, the first signal having a high level may be applied to each of the gate electrodes of the first transistors through the first signal line such that each of the first transistors is turned off, and the second signal having a low level may be applied to each of the gate electrodes of the second transistors through the second signal line such that each of the second transistors is turned on.

In an embodiment, when the display device is driven in the inspection mode, the constant voltage may be applied to the first part of the crack detection line through the constant voltage line.

In an embodiment, when the display device is driven in a normal mode, the first signal having a low level may be applied to each of the gate electrodes of the first transistors through the first signal line such that each of the first transistors is turned on, and the second signal having a high level may be applied to each of the gate electrodes of the second transistors through the second signal line such that each of the second transistors is turned off.

In an embodiment, the first transistors may be connected to a ground of the printed circuit board and when the display device is driven in the normal mode, a ground voltage may be applied to the first part of the crack detection line through the printed circuit board.

In an embodiment, the display device may further include a semiconductor element including an active layer disposed on the substrate in the display area, a gate electrode overlapping a channel area of the active layer in the plan view, a source electrode connected to a source area of the active layer, and a drain electrode connected to a drain area of the active layer, a connection electrode disposed on the semiconductor element and connected to the semiconductor element, and a touch sensing structure including a sensing connection pattern disposed on the semiconductor element and a sensing electrode pattern disposed on the sensing connection pattern.

In an embodiment, the crack detection line may include: a first conductive pattern disposed on the substrate in the pad area, a second conductive pattern disposed on the substrate in the bending area, extending to a part of the peripheral area and a part of the pad area, and connected to the first conductive pattern, and a touch conductive pattern disposed on the substrate in the peripheral area and connected to the second conductive pattern.

In an embodiment, the first conductive pattern may be disposed in the same layer as the source electrode and the drain electrode, the second conductive pattern may be disposed in the same layer as the connection electrode, and the touch conductive pattern may be disposed in the same layer as the sensing electrode pattern.

A display device according to another embodiment of the present disclosure includes: a substrate including a display area on which a plurality of pixels are disposed, a peripheral area surrounding the display area, a hole area positioned inside the display area, a pad area, and a bending area positioned between the peripheral area and the pad area in a plan view: a crack detection line including a first part disposed on the substrate in the pad area and extending to the bending area and the peripheral area and a second part connected to the first part, disposed to surround the hole area, and extending to the peripheral area, the bending area and the pad area: a printed circuit board disposed on the substrate in the pad area; a first transistor disposed on the substrate in the pad area, where a gate electrode of the first transistor is connected to a signal line to receive a signal, a first electrode of the first transistor is connected to the printed circuit board; and a second electrode of the first transistor is connected to the first part of the crack detection line, and a second transistor disposed on the substrate in the pad area, where a gate electrode of the second transistor is connected to the signal line to receive the signal, a first electrode of the second transistor is connected to a constant voltage line for applying a constant voltage, and a second electrode of the second transistor is connected to the first part of the crack detection line.

In an embodiment, the display device may further include a driving chip disposed on the substrate in the pad area. The driving chip may be connected to the signal line and provide the signal to the signal line.

In an embodiment, the gate electrode of the first transistor and the gate electrode of the second transistor may be connected to each other.

In an embodiment, the first transistor may include a (1-1)-th transistor and a (1-2)-th transistor. The (1-1)-th transistor and the (1-2)-th transistor may be connected in series with each other. The second transistor may include a (2-1)-th transistor and a (2-2)-th transistor. The (2-1)-th transistor and the (2-2)-th transistor may be connected in series with each other.

In an embodiment, when the display device is driven in an inspection mode, the signal having a low level may be applied to the gate electrode of the first transistor through the signal line such that the first transistor is turned off, and the signal having the low level may be applied to the gate electrode of the second transistor through the signal line such that the second transistor is turned on.

In an embodiment, when the display device is driven in the inspection mode, the constant voltage may be applied to the first part of the crack detection line through the constant voltage line.

In an embodiment, when the display device is driven in a normal mode, the signal having a high level may be applied to the gate electrode of the first transistor through the signal line such that the first transistor is turned on, and the signal having the high level may be applied to the gate electrode of the second transistor through the signal line such that the second transistor is turned off.

In an embodiment, the first electrode of the first transistor may be connected to a ground of the printed circuit board and when the display device is driven in the normal mode, a ground voltage may be applied to the first part of the crack detection line through the printed circuit board.

A display device according to still another embodiment of the present disclosure may include: a substrate including a display area on which a plurality of pixels are disposed, a peripheral area surrounding the display area, a hole area positioned inside the display area, a pad area, and a bending area positioned between the peripheral area and the pad area in a plan view; a crack detection line including a first part disposed on the substrate in the pad area and extending to the bending area and the peripheral area and a second part connected to the first part, disposed to surround the hole area, and extending to the bending area and the pad area: a driving chip disposed on the substrate in the pad area and connected to a signal line to provide a signal to the signal line: and a plurality of transistors disposed on the substrate in the pad area and connected in series between a constant voltage line for applying a constant voltage and the first part of the crack detection line, where each of gate electrodes of the transistors is connected to the signal line to receive the signal.

In an embodiment, when the display device is driven in an inspection mode, the signal having a low level may be applied to each of the gate electrodes of the transistors through the signal line such that each of the transistors is turned on, and the constant voltage may be applied to the first part of the crack detection line through the constant voltage line.

In an embodiment, when the display device is driven in a normal mode, the signal having a high level may be applied to each of the gate electrodes of the transistors through the signal line such that each of the transistors is turned off and the crack detection line may be in a floating state.

In a display device according to an embodiment of the present disclosure, when the display device is driven in a normal mode, which is a mode generally used by a user, a ground voltage may be applied to a first part of a first crack detection line. When the display device is driven in an inspection mode for inspecting crack in a hole formed in a hole area, a high voltage may be applied to the first part of the first crack detection line.

Accordingly, failure of the first crack detection line for inspecting the crack in the hole formed in the hole area of the display device due to corrosion that may occur when driving for a long time in a high temperature, high humidity environment, and a general user environment may be effectively improved.

In addition, failure of driving signal lines positioned adjacent to the first crack detection line due to corrosion of the first crack detection line may be effectively improved.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
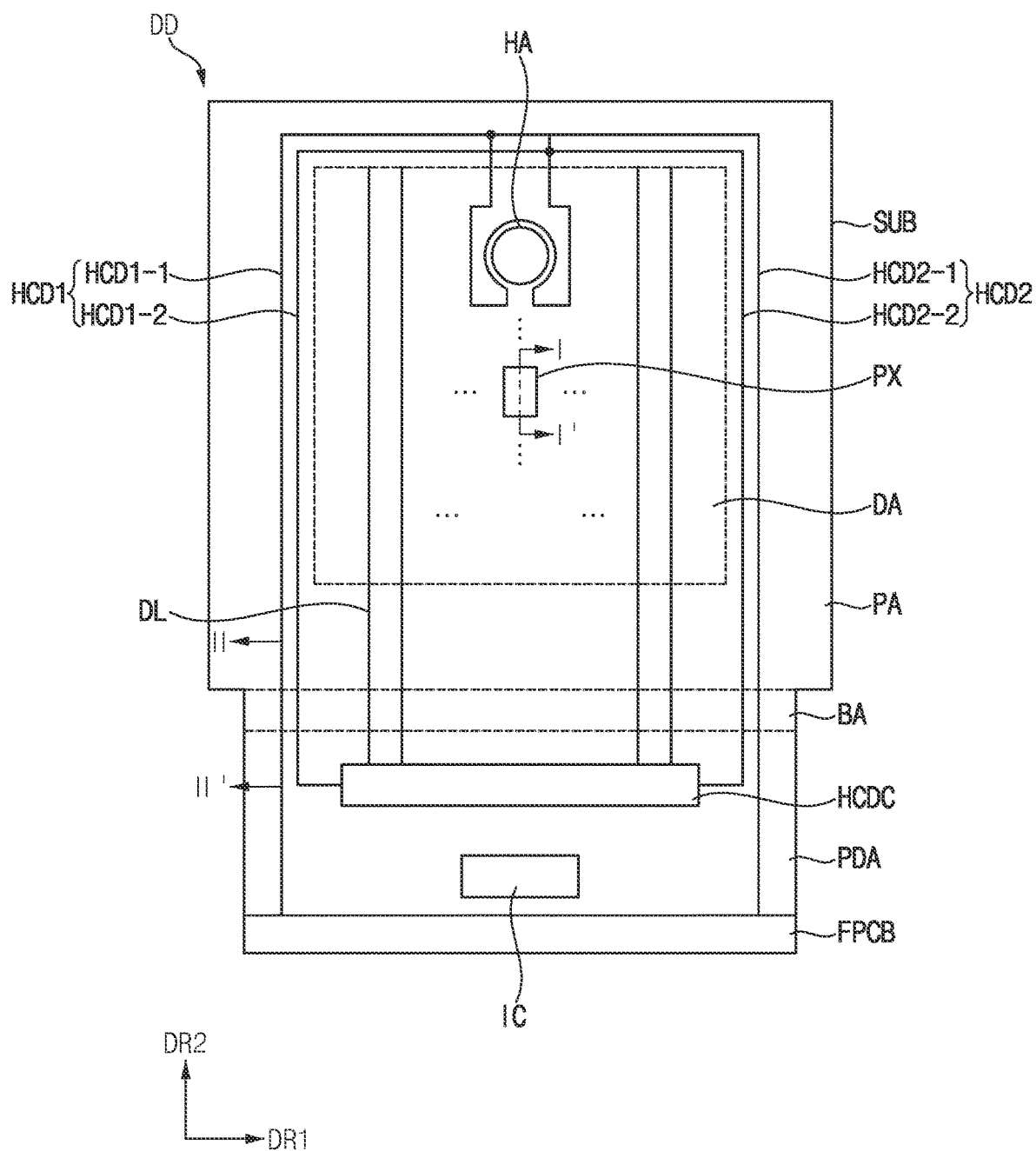
FIG. 1 is a plan view illustrating a display device according to an embodiment.

The terminology used herein is for the purpose of describing particular embodiments only and is not intended to be limiting. As used herein, "a", "an," "the," and "at least one"

do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be understood that when an element is referred to as being "on" another element, it can be directly on the other element or intervening elements may be present therebetween. In contrast, when an element is referred to as being "directly on" another element, there are no intervening elements present.

Hereinafter, a display device including the same according to embodiments of the present disclosure will be explained in detail with reference to the accompanying drawings. The same reference numerals are used for the same components in the drawings, and redundant descriptions of the same components will be omitted.

Figure 2:
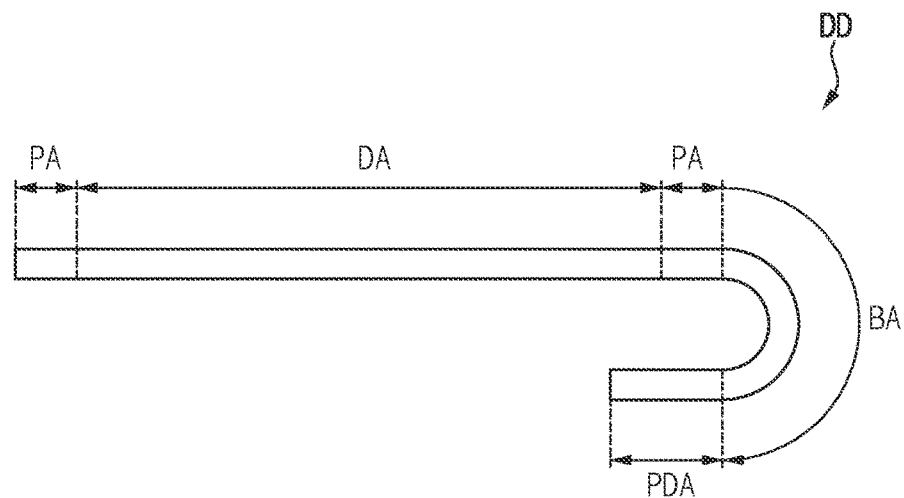
FIG. 2 is a diagram illustrating a bent shape of the display device of FIG. 1.
Figure 3:
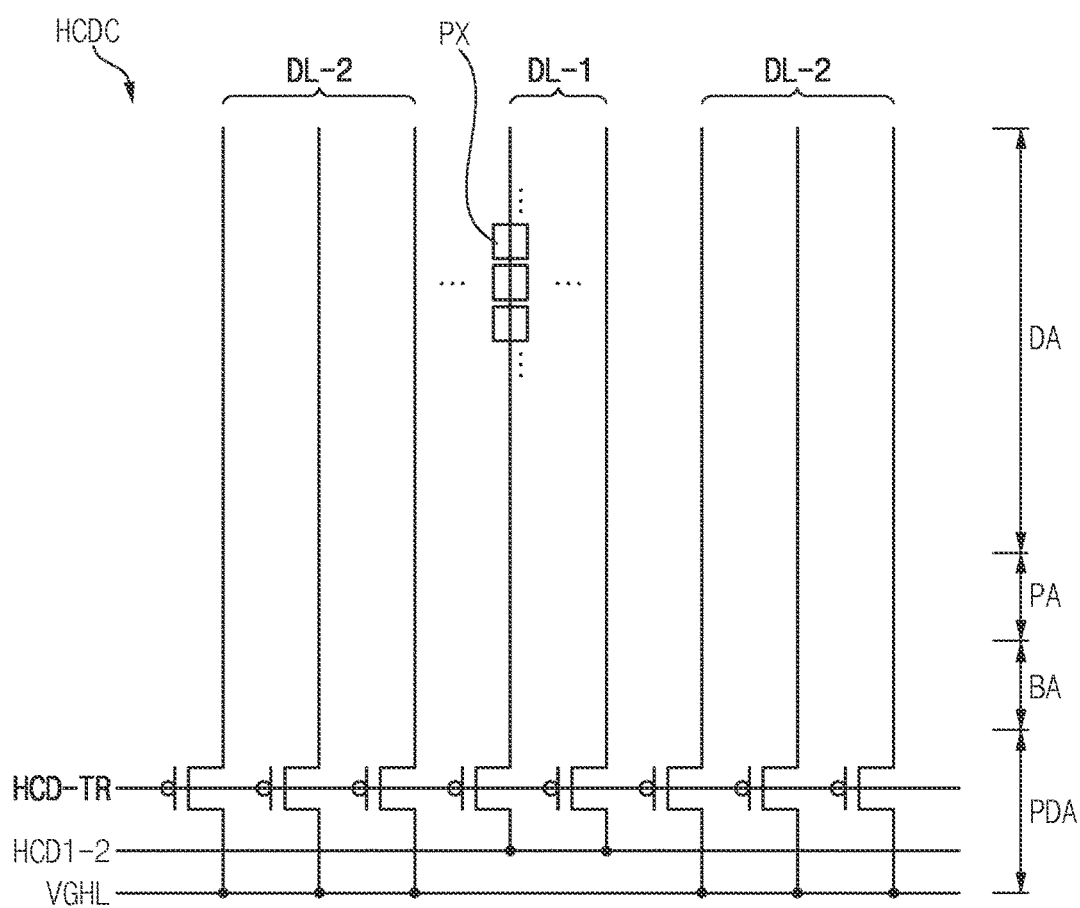
FIG. 3 is a circuit diagram illustrating a crack detection circuit included in the display device of FIG. 1

FIG. 1 is a plan view illustrating a display device according to an embodiment. FIG. 2 is a diagram illustrating a bent shape of the display device of FIG. 1. FIG. 3 is a circuit diagram illustrating a crack detection circuit included in the display device of FIG. 1. As used herein, the "plan view" is a view in a direction perpendicular to the first direction DR1 and the second direction DR2.

Referring to FIGS. 1 and 2, the display device DD according to an embodiment of the present disclosure may include a substrate SUB, a plurality of pixels PX, a first crack detection line HCD1, a second crack detection line HCD2, data wires DL, a crack detection circuit HCDC, a driving chip IC, and a printed circuit board FPCB.

The substrate SUB may include a display area DA, a hole area HA, a peripheral area PA, a bending area BA, and a pad area PDA. The peripheral area PA may surround at least a part of the display area DA. The display area may be an area displaying an image by emitting light. The peripheral area PA may be an area that does not display the image.

The plurality of pixels PX each including a semiconductor element (e.g., a semiconductor element TFT in FIG. 5) and a light emitting element (e.g., a light emitting element LD in FIG. 5) may be disposed on the substrate SUB in the display area DA. The plurality of pixels PX may generate light according to a driving signal. The plurality of pixels PX may be arranged in a first direction DR1 and a second direction DR2 crossing the first direction DR1. Here, the second direction DR2 may be a direction substantially perpendicular to the first direction DR1.

Data lines DL connected to the plurality of pixels PX may be further disposed on the substrate SUB in the display area DA. In addition, gate wires, power supply wires or the like connected to the plurality of pixels PX may be disposed on the substrate SUB in the display area DA.

The hole area HA may be positioned in the display area DA. A hole may be formed in the hole area HA. The hole may pass through the substrate SUB. In an embodiment, a functional module may be disposed under the substrate SUB corresponding to the hole. The functional module may receive external light passing through the hole or may transmit signals such as infrared rays and ultrasonic wave. In an embodiment, for example, the functional module may include a camera module for capturing an image of an object located in front of the display device DD, a face recognition sensor module for detecting a user's face, etc.

In an embodiment, the hole area HA may have a circular shape in a plan view. However, the present disclosure is not limited thereto, and in another embodiment, the hole area HA may have a polygonal shape or an elliptical shape in a plan view. In addition, although FIG. 1 illustrates that one hole area HA having a hole formed therein is positioned in the display area DA, the present disclosure is not limited thereto. In an embodiment, for example, a plurality of hole areas each having a hole formed therein may be positioned in the display area DA.

As illustrated in FIG. 2, the bending area BA may extend from one side of the peripheral area PA and may be bent downward. That is, when the bending area BA is bent in the first direction DR1 as an axis, the pad area PDA may be positioned on a lower surface of the display device DD. The pad area PDA may extend from the bending area BA and be positioned under the display area DA or the peripheral area PA. As illustrated in FIG. 1, when the display device is unfolded, the bending area BA may be positioned between the display area DA and the pad area PDA.

The first crack detection line HCD1 and the second crack detection line HCD2 may be disposed on the substrate SUB in the peripheral area PA, the bending area BA, and the pad area PDA. The first crack detection line HCD1 may include a first part HCD1-1 and a second part HCD1-2. The second crack detection line HCD2 may include a first part HCD2-1 and a second part HCD2-2.

The first part HCD1-1 of the first crack detection line HCD1 may be disposed on the substrate SUB in the pad area PDA and may extend to the bending area BA and the peripheral area PA. That is, the first part HCD1-1 of the first crack detection line HCD1 may be positioned in the lower, left, and upper peripheral area PA with the display area DA as the center.

One end of the second part HCD1-2 of the first crack detection line HCD1 may be connected to the first part HCD1-1 of the first crack detection line HCD1. The second part HCD1-2 of the first crack detection line HCD1 may be disposed to surround the periphery of the hold area HA and may extend to the bending area BA and the pad area PDA. That is, the second part HCD1-2 of the first crack detection line HCD1 may be positioned in the lower, left, and upper peripheral area PA with the display area DA as the center. The first part HCD1-1 of the first crack detection line HCD1 and the second part HCD1-2 of the first crack detection line HCD1 may extend in parallel along the edge of the display area DA. The other end of the second part HCD1-2 of the first crack detection line HCD1 may be connected to the crack detection circuit HCDC disposed on the substrate SUB in the pad area PDA.

The first part HCD2-1 of the second crack detection line HCD2 may be disposed on the substrate SUB in the pad area PDA and may extend to the bending area BA and the peripheral area PA. That is, the first part HCD2-1 of the second crack detection line HCD2 may be positioned in the lower, right, and upper peripheral area PA with the display area DA as the center.

One end of the second part HCD2-2 of the second crack detection line HCD2 may be connected to the first part HCD2-1 of the second crack detection line HCD2. The second part HCD2-2 of the second crack detection line HCD2 may be disposed to surround the periphery of the hold area HA and may extend to the bending area BA and the pad area PDA. That is, the second part HCD2-2 of the second crack detection line HCD2 may be positioned in the lower, right, and upper peripheral area PA with the display area DA as the center. The first part HCD2-1 of the second crack detection line HCD2 and the second part HCD2-2 of the second crack detection line HCD2 may extend in parallel along the edge of the display area DA. The other end of the second part HCD2-2 of the second crack detection line HCD2 may be connected to the crack detection circuit HCDC disposed on the substrate SUB in the pad area PDA.

The first part HCD2-1 of the second crack detection line HCD2 and the first part HCD1-1 of the first crack detection line HCD1 may have substantially the same or symmetric shape. Also, the second part HCD2-2 of the second crack detection line HCD2 and the second part HCD1-2 of the first crack detection line HCD1 may have substantially the same or symmetric shape. Therefore, hereinafter, the first crack detection line HCD1 will be mainly described. A description of the second crack detection line HCD2 may be replaced with a description of the first crack detection line HCD1.

The display device DD may be driven in a normal mode, which is a mode generally used by a user, or an inspection mode in which cracks in the hole formed in the hole area HA are inspected. When the display device DD is driven in the normal mode, the driving chip IC may output the data signal. When the display device DD is driven in the inspection mode, the driving chip IC may not output the data signal.

Referring further to FIG. 3, the crack detection circuit HCDC may be disposed on the substrate SUB in the pad area PDA. The crack detection circuit HCDC may include the data lines DL, a plurality of inspection transistors HCD-TR, the plurality of pixels PX, the second part HCD1-2 of the first crack detection line HCD1, and a constant voltage line VGHL. The data lines DL may include first data lines DL-1 and second data lines DL-2.

The data lines DL may be connected to the pixels PX disposed in the display area DA. Each of the inspection transistors HCD-TR may be connected to the data lines DL. The first data lines DL-1 may be connected to the second part HCD1-2 of the first crack detection line HCD1 through the inspection transistor HCD-TR. The second data lines DL-2 may be connected to the constant voltage line VGHL through the inspection transistor HCD-TR.

When the display device DD is driven in the inspection mode, a constant voltage (e.g., a high voltage) may be applied to the first part HCD1-1 of the first crack detection line HCD1 through the printed circuit board FPCB.

When the display device DD is driven in the inspection mode, an inspection signal may be applied to each of gate electrodes of the inspection transistors HCD-TR. In this case, each of the inspection transistors may be turned on. Accordingly, the constant voltage may be applied to the first data lines DL-1 connected to the second part HCD1-2 of the first crack detection line HCD1 through the second part HCD1-2 of the first crack detection line HCD1 and the inspection transistors HCD-TR. Also, the constant voltage may be applied to the second data lines DL-2 connected to the constant voltage line VGHL through the constant voltage line VGHL and the inspection transistors HCD-TR.

When the display device DD is driven in the inspection mode and a crack does not occur in the hole formed in the hole area HA, the level of the voltage of the second part HCD1-2 of the first crack detection line HCD1 passing around the hole area HA may be constant.

When the display device DD is driven in the inspection mode and the crack occurs in the hole formed in the hole area HA, the level of the voltage of the second part HCD1-2 of the first crack detection line HCD1 passing around the hole area HA may decrease. In this case, due to the turned-on inspection transistors HCD-TR, the voltage of the second part HCD1-2 of the first crack detection line HCD1 may be applied to the first data lines DL-1 connected to the second part HCD1-2 of the first crack detection line HCD1 through the inspection transistors HCD-TR. Accordingly, the plurality of pixels PX connected to the first data lines DL-1 may emit light. That is, the display area DA may display a bright vertical stripe pattern. Through this, the crack of the hole formed in the hole area HA may be detected.

However, although the crack detection circuit HCDC of the present disclosure describes a hole crack detection circuit, the configuration of the present disclosure is not limited thereto. In other embodiments, the crack detection circuit HCDC may include a module crack detection circuit ("MCD circuit") and a bending crack detection circuit ("BCD circuit").

The printed circuit board FPCB may be disposed on the substrate SUB in the pad area PDA. Specifically, a part of the printed circuit board FPCB may overlap the pad area PDA. One end of the printed circuit board FPCB may be electrically connected to pads disposed in the pad area PDA on the substrate SUB, and the other end of the printed circuit board FPCB may be electrically connected to an external device. That is, electrical signals and voltages generated from the external device may be provided to the driving chip IC and the plurality of pixels PX through the printed circuit board FPCB.

The driving chip IC may be disposed on the substrate SUB in the pad area PDA. The driving chip IC may convert a digital data signal among electrical signals into an analog data signal and provide the converted analog data signal to the plurality of pixels PX. In an embodiment, for example, the driving chip IC may be a data driver.

In order to improve the corrosion failure of the first crack detection line HCD1, a plurality of transistors may be disposed on the substrate in the pad area PDA. This will be described later with reference to FIGS. 8, 9, 10, and 11.

In FIG. 1, the driving chip IC is illustrated as having a chip on plastic ("COP") structure or a chip on glass ("COG") structure disposed on the substrate SUB, but the present disclosure is not limited thereto. In another embodiment, for example, the driving chip IC may have a chip on film ("COF") structure disposed directly on a flexible film. In this case, the printed circuit board FPCB may be electrically connected to the flexible film.

Figure 4:
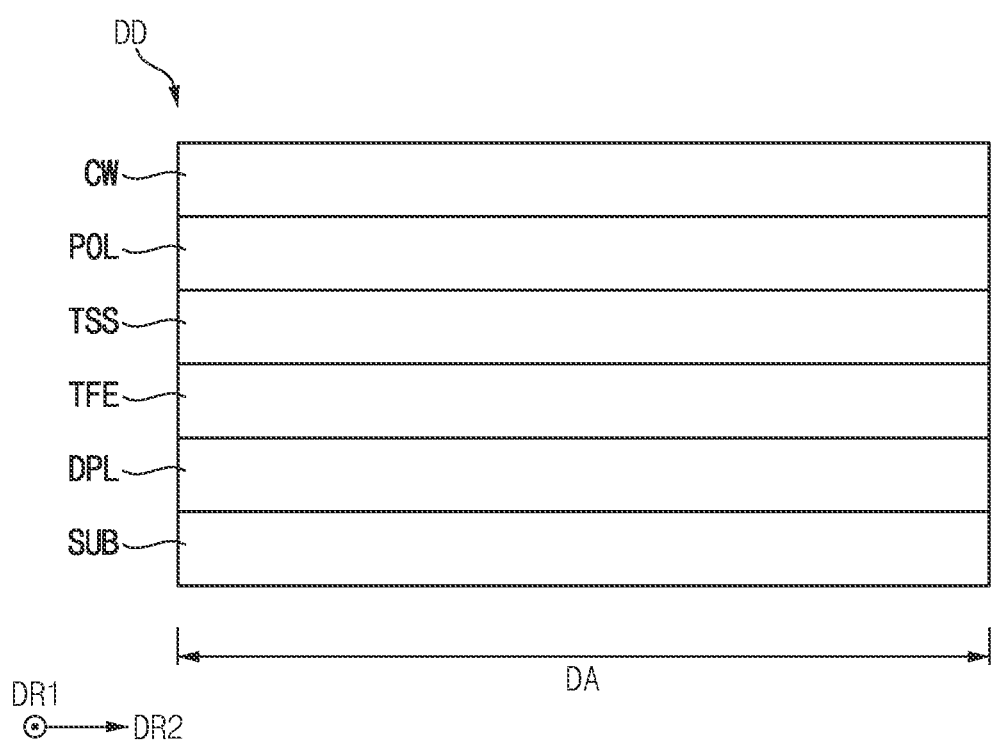
FIG. 4 is a cross-sectional view illustrating a part of a display area of the display device of FIG. 1.

FIG. 4 is a cross-sectional view illustrating a part of a display area of the display device of FIG. 1.

Referring to FIG. 4, the display device DD according to an embodiment may include the substrate SUB, a display layer DPL, a thin film encapsulation structure TFE, a touch sensing structure TSS, a polarization member POL, and a cover window CW.

The substrate SUB may include a transparent or opaque material. The substrate SUB may include a transparent resin substrate. In an embodiment, for example, the transparent resin substrate that can be used as the substrate SUB may be a polyimide substrate. In this case, the polyimide substrate may include a first polyimide layer, a barrier film layer, a second polyimide layer, etc.

The display layer DPL may be disposed on the substrate SUB. The display layer DPL may include a semiconductor element, an insulating layer, a light emitting element, etc. A detailed description of components of the display layer DPL will be described layer with reference to FIG. 5.

The thin film encapsulation structure TFE may be disposed on the display layer DPL. The thin film encapsulation structure TFE may cover the display layer DPL. The thin film encapsulation structure TFE may prevent the display layer DPL from being damaged by moisture, oxygen, etc. A detailed description of components of the thin film encapsulation structure TFE will be described layer with reference to FIG. 5.

The touch sensing structure TSS may be disposed on the thin film encapsulation structure TFE. The touch sensing structure TSS may acquire coordination information according to an external input. In an embodiment, for example, the touch sensing structure TSS may sense the external input using a mutual cap method or a self-cap method. A detailed description of components of the touch sensing structure TSS will be described later with reference to FIGS. 5 and 7.

The polarization member POL may be disposed on the touch sensing structure TSS. External light may be incident to the display device DD. The external light may be reflected from various electrodes or wires included in the display layer DPL. The polarization member POL may prevent the external light from being recognized as the external light is reflected.

The cover window CW may be disposed on the polarization member POL. In an embodiment, for example, the cover window CW may be formed using reinforced glass or reinforced plastic. However, the embodiments of the present disclosure are not limited thereto, and in another embodiment, a transparent material may be used to form the cover window CW.

Figure 5:
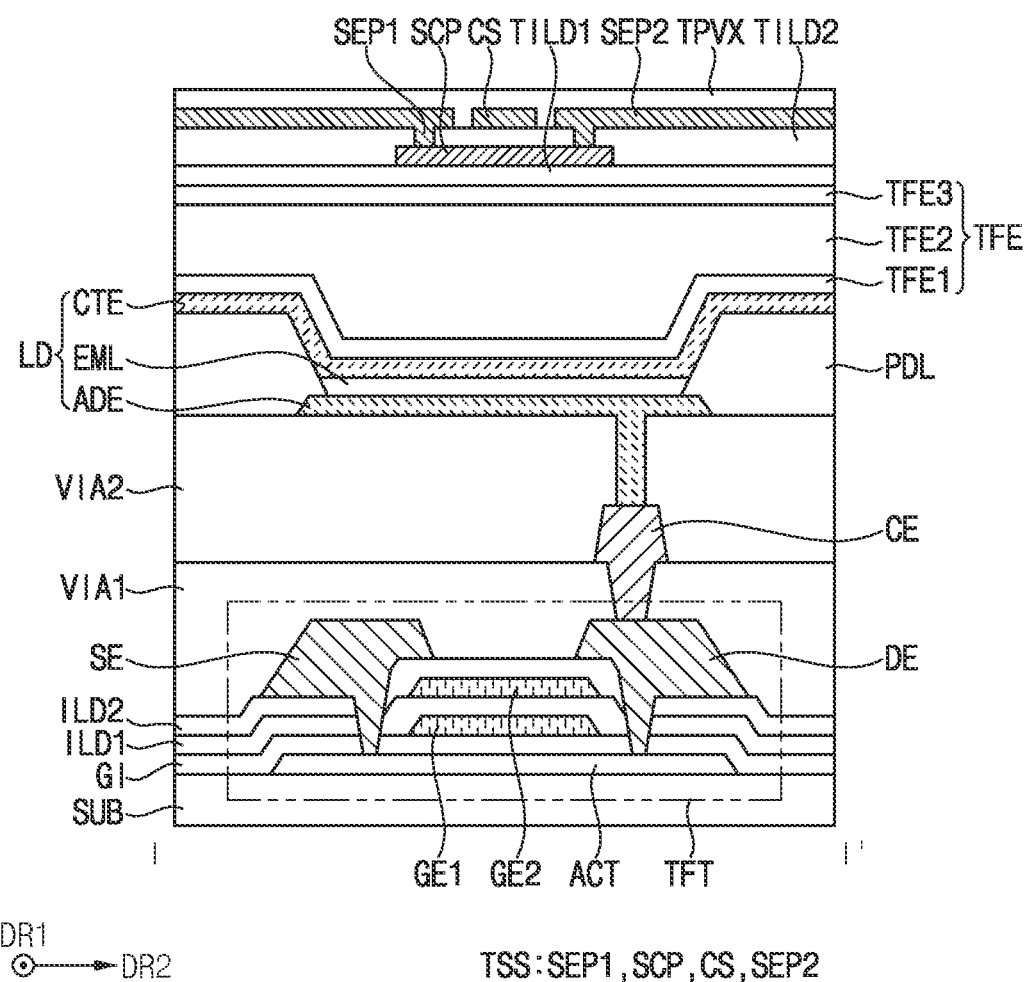
FIG. 5 is a cross-sectional view taken along line I-I' of FIG. 1.
Figure 6:
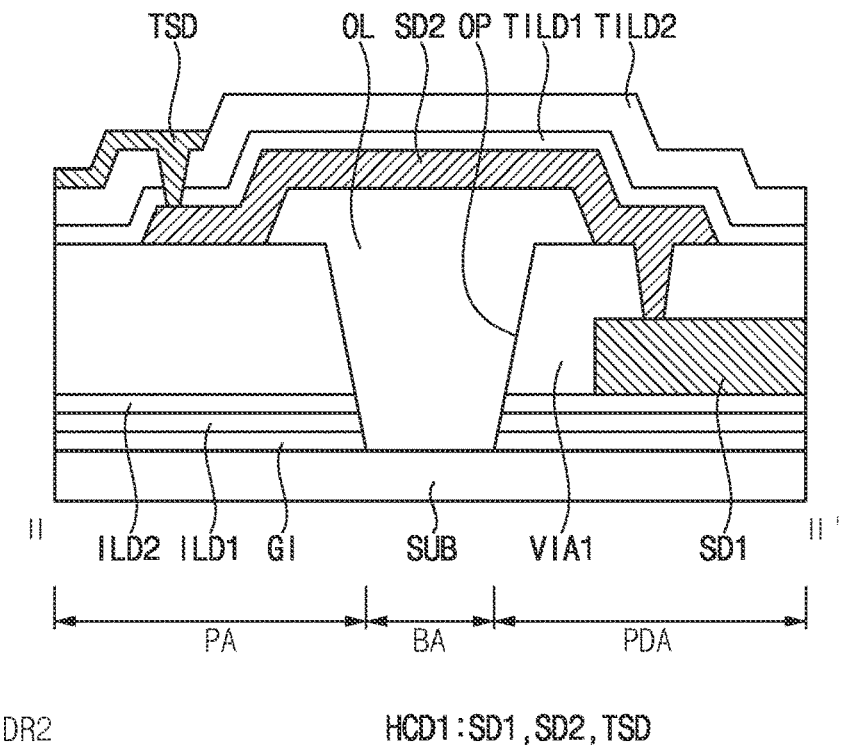
FIG. 6 is a cross-sectional view taken along line II-II' of FIG. 1
Figure 7:
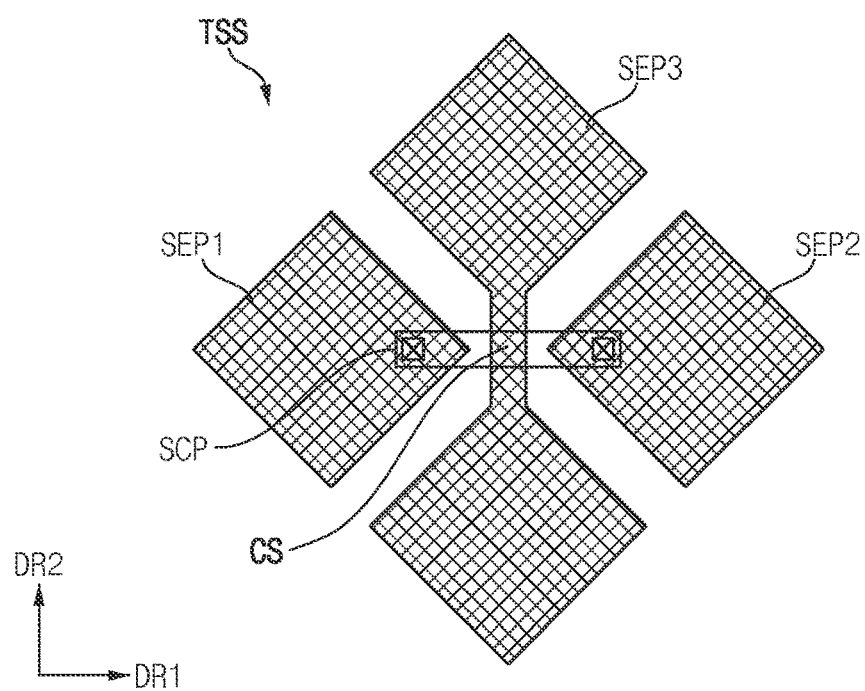
FIG. 7 is a plan view illustrating a touch sensing structure included in the display device of FIGS. 5 and 6.

FIG. 5 is a cross-sectional view taken along line I-I' of FIG. 1. FIG. 6 is a cross-sectional view taken along line II-II' of FIG. 1. FIG. 7 is a plan view illustrating a touch sensing structure included in the display device of FIGS. 5 and 6.

Referring to FIGS. 5, 6, and 7, the display device DD according to an embodiment may include the substrate SUB, a gate insulating layer GI, a first interlayer-insulating layer ILD1, a second interlayer-insulating layer ILD2, a semiconductor element TFT, a first via-insulating layer VIA1, a second via-insulating layer VIA2, a connection electrode CE, a pixel defining layer PDL, a light emitting element LD, the thin film encapsulation structure TFE, the touch sensing structure TSS, a first touch insulating layer TILD1, a second touch insulating layer TILD2, a touch protection layer TPVX, and the first crack detection line HCD1.

Here, the semiconductor element TFT may include an active layer ACT, a first gate electrode GE1, a second gate electrode GE2, a source electrode SE, and a drain electrode DE. And the light emitting element LD may include a lower electrode ADE, a light emitting layer EML, and an upper electrode CTE. The thin film encapsulation structure TFE may include a first inorganic thin film encapsulation layer TFE1, an organic thin film encapsulation layer TFE2, and a second inorganic thin film encapsulation layer TFE3. The touch sensing structure TSS may include a sensing connection pattern SCP, a first sensing electrode pattern SEP1, a second sensing electrode pattern SEP2, and a connection part CS. The first crack detection line HCD1 may include a first conductive pattern SD1, a second conductive pattern SD2, and a touch conductive pattern TSD.

The substrate SUB may include a transparent or opaque material. The substrate SUB may include a transparent resin substrate. In an embodiment, for example, the transparent resin substrate that can be used as the substrate SUB may be a polyimide substrate.

A buffer layer may be disposed on the substrate SUB. The buffer layer may prevent diffusion of metal atoms or impurities from the substrate SUB to an upper structure (e.g., the semiconductor element TFT, the light emitting element LD, and the like). And the buffer layer may control a heat transfer rate during a crystallization process for forming the active layer ACT to obtain a substantially uniform active layer ACT. In addition, when a surface of the substrate SUB is not uniform, the buffer layer may serve to improve the flatness of the surface of the substrate SUB. In an embodiment, for example, the buffer layer may include an organic insulating material or an inorganic insulating material.

The active layer ACT may be disposed on the substrate in the display area DA. The active layer ACT may include an oxide semiconductor, a silicon semiconductor, an organic semiconductor, etc. In an embodiment, for example, the oxide semiconductor may include Indium (In), gallium (Ga), tin (Sn), zirconium (Zr), vanadium (V), hafnium (Hf), cadmium (Cd), germanium (Ge), chromium (Cr), titanium (Ti), zinc (Zn), etc. These may be used alone or in combination with each other. The silicon semiconductor may include amorphous silicon, polycrystalline silicon, etc. The active layer ACT may include a source region, a drain region, and a channel region positioned between the source region and the drain region.

The gate insulating layer GI may be disposed on the substrate in the display area DA, the peripheral area PA, and the pad area PDA. The gate insulating layer GI may have an opening exposing an upper surface of the substrate SUB positioned in the bending area BA. The gate insulating layer GI may cover the active layer ACT on the substrate SUB, and may be disposed along a profile of the active layer ACT with a uniform thickness. Alternatively, the gate insulating layer GI may sufficiently cover the active layer ACT on the substrate SUB, and may have a substantially flat upper surface without creating a step around the active layer ACT. The gate insulating layer GI may include a silicon compound, a metal oxide, etc. In an embodiment, for example, the gate insulating layer GI may include silicon oxide ($SiO_x$), silicon nitride ($SiN_x$), silicon carbide ($SiC_x$), silicon oxynitride ($SiO_xN_y$), silicon oxycarbide ($SiO_xC_y$), etc. These may be used alone or in combination with each other.

The first gate electrode GE1 may be disposed on the gate insulating layer GI in the display area DA. The first gate electrode GE1 may overlap the channel region of the active layer ACT. In an embodiment, for example, the first gate electrode GE1 may include a metal, a metal alloy, a metal nitride, a conductive metal oxide, a transparent conductive material, etc. These may be used alone or in combination with each other.

The first interlayer-insulating layer ILD1 may be disposed on the gate insulating layer GI in the display area DA, the peripheral area PA, and the pad area PDA. The first interlayer-insulating layer ILD1 may have an opening exposing an upper surface of the substrate SUB positioned in the bending area BA. The first interlayer-insulating layer ILD1 may cover the first gate electrode GE1 and may have a uniform thickness. Alternatively, the first interlayer-insulating layer ILD1 may have a substantially flat upper surface without creating a step around the first gate electrode GE on the gate insulating layer GI. In an embodiment, for example, the first interlayer-insulating layer ILD1 may include a silicon compound or a metal oxide, etc.

The second gate electrode GE2 may be disposed on the first interlayer-insulating layer ILD1 in the display area DA. That is, the second gate electrode GE2 may overlap the first gate electrode GE1. In an embodiment, for example, the second gate electrode GE2 may include a metal, a metal alloy, a metal nitride, a conductive metal oxide, a transparent conductive material, etc. These may be used alone or in combination with each other.

The second interlayer-insulating layer ILD2 may be disposed on the first interlayer-insulating layer ILD1 in the display area DA, the peripheral area PA, and the pad area PDA. The second interlayer-insulating layer ILD2 may have an opening exposing an upper surface of the substrate SUB positioned in the bending area BA. The second interlayer-insulating layer ILD2 may cover the second gate electrode GE2, and may have a uniform thickness. Alternatively, the second interlayer-insulating layer ILD2 may have a substantially flat upper surface without creating a step around the second gate electrode GE2 on the first interlayer-insulating layer ILD1. In an embodiment, for example, the second interlayer-insulating layer ILD2 may include a silicon compound, a metal oxide, etc.

The source electrode SE and the drain electrode DE may be disposed on the second interlayer-insulating layer ILD2 in the display area DA. The source electrode SE may be connected to the source region of the active layer ACT through a contact hole formed by removing a first part of the gate insulating layer GI, the first interlayer-insulating layer ILD1, and the second interlayer-insulating layer ILD2. The drain electrode DE may be connected to the drain region of the active layer ACT through a contact hole formed by removing a second part of the gate insulating layer GI, the first interlayer-insulating layer ILD1, and the second interlayer-insulating layer ILD2. In an embodiment, for example, each of the source electrode SE and the drain electrode DE may include a metal, a metal alloy, a metal nitride, a conductive metal oxide, a transparent conductive material, etc. These may be used alone or in combination with each other.

The first conductive pattern SD1 may be disposed on the second interlayer-insulating layer ILD2 in the pad area PDA. In an embodiment, for example, the first conductive pattern SD1 may include a metal, a metal alloy, a metal nitride, a conductive metal oxide, a transparent conductive material, etc. These may be used alone or in combination with each other. In an embodiment, the first conductive pattern SD1 may be disposed in the same layer as the source electrode SE and the drain electrode DE. That is, the first conductive pattern SD1 may include the same material as the source electrode SE and the drain electrode DE. In another embodiment, the first conductive pattern SD1 may be disposed in the same layer as the first gate electrode GE1 or the second gate electrode GE2. In this case, the first conductive pattern SD1 may include the same material as the first gate electrode GE1 or the second gate electrode GE2.

The first via-insulating layer VIA1 may be disposed on the second interlayer-insulating layer ILD2 in the display area DA, the peripheral area PA, and the pad area PDA. The first via-insulating layer VIA1 may define an opening OP therein exposing an upper surface of the substrate SUB positioned in the bending area BA. In an embodiment, for example, the first via-insulating layer VIA1 may be disposed on the second interlayer-insulating layer ILD2 with a relatively thick thickness to sufficiently cover the source electrode SE, the drain electrode DE, and the first conductive pattern SD1. In this case, the first via-insulating layer VIA1 may have a substantially flat upper surface. In order to implement such the flat upper surface of the first via-insulating layer VIA1, a planarization process may be performed on the first via-insulating layer VIA1. The first via-insulating layer VIA1 may have a first contact hole exposing an upper surface of the drain electrode DE in the display area DA, and have a second contact hole exposing an upper surface of the first conductive pattern SD1 in the pad area PDA.

The first via-insulating layer VIA1 may include an organic insulating material or an inorganic insulating material. In an embodiment, the first via-insulating layer VIA1 may include the organic insulating material. In an embodiment, for example, the first via-insulating layer VIA1 may include a photoresist, a polyacrylic resin, a polyimide-based resin, a polyamide-based resin, a siloxane-based resin, an acrylic resin, an epoxy-based resin, etc. These may be used alone or in combination with each other.

The organic layer OL may be disposed on the substrate SUB in the bending area BA. The organic layer OL may fill the opening of each of the gate insulating layer GI, the first interlayer-insulating layer ILD1, the second interlayer-insulating layer ILD2, and the first via-insulating layer VIA1. The organic layer OL may relieve stress in the bending area BA. In an embodiment, for example, the organic layer OL may include a photoresist, a polyacrylic resin, a polyimide-based resin, a polyamide-based resin, a siloxane-based resin, an acrylic resin, an epoxy-based resin, etc. These may be used alone or in combination with each other.

The connection electrode CE may be disposed on the first via-insulating layer VIA1 in the display area DA. The connection electrode CE may be connected to the drain electrode DE through the first contact hole of the first via-insulating layer VIA1. In an embodiment, for example, the connection electrode CE may include a metal, a metal alloy, a metal nitride, a conductive metal oxide, a transparent conductive material, etc. These may be used alone or in combination with each other.

The second conductive pattern SD2 may be disposed on the organic layer OL in the bending area BA. The second conductive pattern SD2 may extend through a part of the peripheral area PA and a part of the pad area PDA. The second conductive pattern SD2 may be connected to the first conductive pattern SD1 through the second contact hole of the first via-insulating layer VIA1. In an embodiment, for example, the second conductive pattern SD2 may include a metal, a metal alloy, a metal nitride, a conductive metal oxide, a transparent conductive material, etc. These may be used alone or in combination with each other. In an embodiment, the second conductive pattern SD2 may be disposed in the same layer as the connection electrode CE. That is, the second conductive pattern SD2 may include the same material as the connection electrode CE.

The second via-insulating layer VIA2 may be disposed on the first via-insulating layer VIA1 in the display area DA. That is, the second via-insulating layer VIA2 may not be disposed in the peripheral area PA and the pad area PDA. In an embodiment, for example, the second via-insulating layer VIA2 may be disposed on the first via-insulating layer VIA1 with a relatively thick thickness to sufficiently cover the connection electrode CE. In this case, the second via-insulating layer VIA2 may have a substantially flat upper surface. In order to implement such the flat upper surface of the second via-insulating layer VIA2, the planarization process may be performed on the second via-insulating layer VIA2. Also, the second via-insulating layer VIA2 may have a contact hole exposing an upper surface of the connection electrode CE. In an embodiment, for example, the second via-insulating layer VIA2 may include an organic insulating material or an inorganic insulating material.

The lower electrode ADE may be disposed on the second via-insulating layer VIA2 in the display area DA. The lower electrode ADE may be connected to the connection electrode CE through the contact hole of the second via-insulating layer VIA2. Accordingly, the lower electrode ADE may be electrically connected to the semiconductor element TFT. In an embodiment, for example, the lower electrode ADE may include a metal, a metal alloy, a metal nitride, a conductive metal oxide, a transparent conductive material, etc.

The pixel defining layer PDL may be disposed on the second via-insulating layer VIA2 in the display area DA. The pixel defining layer PDL may cover an edge of the lower electrode ADE and may have an opening exposing an upper surface of the lower electrode ADE. In an embodiment, for example, the pixel defining layer PDL may include an organic insulating material or an inorganic insulating material. In an embodiment, the pixel defining layer PDL may include the organic insulating material.

The light emitting layer EML may be disposed on the lower electrode ADE in the display area DA. That is, the light emitting layer EML may be disposed on the lower electrode ADE exposed by the opening of the pixel defining layer PDL. The light emitting layer EML may be formed using at least one of light emitting materials capable of emitting red light, green light, blue light, etc. according to the type of a sub-pixel. Alternatively, the light emitting layer EML may emit white light as a whole by stacking a plurality of light emitting materials capable of generating light of different colors, such as red light, green light, and blue light.

The upper electrode CTE may be disposed on the pixel defining layer PDL and the light emitting layer EML in the display area DA. In an embodiment, for example, the upper electrode CTE may include a metal, a metal alloy, a metal nitride, a conductive metal oxide, a transparent conductive material, etc. These may be used alone or in combination with each other.

Accordingly, the light emitting element LD including the lower electrode ADE, the light emitting layer EML, and the upper electrode CTE may be disposed on the substrate SUB in the display area DA.

The first inorganic thin film encapsulation layer TFE1 may be disposed on the upper electrode CTE in the display area DA. The first inorganic thin film encapsulation layer TFE1 may cover the upper electrode CTE and may be disposed along a profile of the upper electrode CTE with a uniform thickness. The first inorganic thin film encapsulation layer TFE1 may prevent the light emitting element LD from being deteriorated due to penetration of moisture, oxygen, etc. In addition, the first inorganic thin film encapsulation layer TFE1 may also function to protect the light emitting element LD from external impact. In an embodiment, for example, the first inorganic thin film encapsulation layer TFE1 may include an inorganic insulating material having flexibility.

The organic thin film encapsulation layer TFE2 may be disposed on the first inorganic thin film encapsulation layer TFE1. The organic thin film encapsulation layer TFE2 may improve flatness of the display device DD. Also, the organic thin film encapsulation layer TFE2 may protect the light emitting element LD together with the first inorganic thin film encapsulation layer TFE1. In an embodiment, for example, the organic thin film encapsulation layer TFE2 may include an organic material having flexibility.

The second inorganic thin film encapsulation layer TFE3 may be disposed on the organic thin film encapsulation layer TFE2. The second inorganic thin film encapsulation layer TFE3 may cover the organic thin film encapsulation layer TFE2 and may be disposed along a profile of the organic thin film encapsulation layer TFE2 with a uniform thickness. The second inorganic thin film encapsulation layer TFE3 may prevent the light emitting element LD from being deteriorated due to penetration of moisture, oxygen, etc. together with the first inorganic thin film encapsulation layer TFE1. Also, the second inorganic thin film encapsulation layer TFE3 may protect the light emitting element LD from external impact together with the first inorganic thin film encapsulation layer TFE1 and the organic thin film encapsulation layer TFE2. In an embodiment, for example, the second inorganic thin film encapsulation layer TFE3 may include an inorganic insulating material having flexibility.

Alternatively, the thin film encapsulation structure TFE may have a five-layer structure in which three inorganic thin film encapsulation layers and two organic thin film encapsulation layers are stacked or may have a seven-layer structure in which four inorganic thin film encapsulation layers and three organic thin film encapsulation layers are stacked.

The first touch insulating layer TILD1 may be disposed on the second inorganic thin film encapsulation layer TFE3 in the display area DA. The first touch insulating layer TILD1 may extend to the peripheral area PA, the bending area BA, and the pad area PDA. In an embodiment, for example, the first touch insulating layer TILD1 may include an inorganic insulating material or an organic insulating material.

The sensing connection pattern SCP may be disposed on the first touch insulating layer TILD1 in the display area DA. As illustrated in FIG. 7, the sensing connection pattern SCP may electrically connect the first sensing electrode pattern SEP1 and the second sensing electrode pattern SEP2 through contact holes. In an embodiment, for example, the sensing connection pattern SCP may include the same material as the first sensing electrode pattern SEP1 and the second sensing electrode pattern SEP2. Alternatively, the sensing connection pattern SCP may include a metal, a metal alloy, a metal nitride, a conductive metal oxide, a transparent conductive material, etc. These may be used alone or in combination with each other.

The second touch insulating layer TILD2 may be disposed on the first touch insulating layer TILD1 in the display area DA, the peripheral area PA, the bending area BA, and the pad area PDA. The second touch insulating layer TILD2 may sufficiently cover the sensing connection pattern SCP. In an embodiment, for example, the second touch insulating layer TILD2 may include an organic insulating material or an inorganic insulating material.

The first sensing electrode pattern SEP1, the second sensing electrode pattern SEP2, and the connection part CS may be disposed on the second touch insulating layer TILD2 in the display area DA. Also, as illustrated in FIG. 7, a third sensing electrode pattern SEP3 may be disposed on the second touch insulating layer TILD2 in the display area DA. In this case, the third sensing electrode pattern SEP3 may be disposed in the same layer as the connection part CS. In an embodiment, for example, each of the first sensing electrode pattern SEP1, the second sensing electrode pattern SEP2, the third sensing electrode pattern SEP3, and the connection part CS may include a carbon nano tube ("CNT"), transparent conductive material, or the like. transparent conductive oxide, indium tin oxide ("ITO"), indium gallium zinc oxide ("IGZO"), zinc oxide (ZnO), graphene, silver nanowire ("AgNW"), copper (Cu), chromium (Cr), titanium (Ti), aluminum (Al), etc. These may be used alone or in combination with each other.

The touch conductive pattern TSD may be disposed on the second touch insulating layer TILD2 in the peripheral area PA. The touch conductive pattern TSD may be connected to the second conductive pattern SD2 through a contact hole formed by removing a part of the first touch insulating layer TILD1 and a part of the second touch insulating layer TILD2. In an embodiment, the touch conductive pattern TSD may be disposed in the same layer as the first sensing electrode pattern SEP1, the second sensing electrode pattern SEP2, the third sensing electrode pattern SEP3, and the connection part CS. That is, the touch conductive pattern TSD may include the same material as the first sensing electrode pattern SEP1, the second sensing electrode pattern SEP2, the third sensing electrode pattern SEP3, and the connection part CS.

Accordingly, the first crack detection line HCD1 including the first conductive pattern SD1, the second conductive pattern SD2, and the touch conductive pattern TSD may be disposed on the substrate SUB in the peripheral area PA, the bending area BA, and the pad area PDA. However, although the first crack detection line HCD1 is described as an example in FIG. 5, the present disclosure is not limited thereto. In another embodiment, for example, the second crack detection line HCD2 illustrated in FIG. 1 may include the same elements as the first crack detection line HCD1.

The touch protection layer TPVX may be disposed on the second touch insulating layer TILD2, the first sensing electrode pattern SEP1, the second sensing electrode pattern SEP2, and the connection part CS in the display area DA. The touch protection layer TPVX may sufficiently cover the first sensing electrode pattern SEP1, the second sensing electrode pattern SEP2, and the connection part CS.

The touch sensing structure TSS of the present disclosure is not limited to the structure illustrated in FIGS. 5 and 7. The touch sensing structure TSS may have various known structures. In an embodiment, for example, the first and second sensing electrode patterns SEP1 and SEP2 and the third sensing electrode pattern SEP3 may be disposed on different layers, so that the first and second sensing electrode patterns SEP1 and SEP2 may have a continuous structure without the sensing connection pattern SCP.

In addition, although the display device DD of the present disclosure is described by limiting the organic light emitting display device, the configuration of the present disclosure is not limited thereto. In other embodiments, the display device DD may include a liquid crystal display device ("LCD"), a field emission display device ("FED"), a plasma display device ("PDP"), an electrophoretic display device ("EPD"), an inorganic light emitting display device ("ILED"), or a quantum dot display device.

Figure 8:
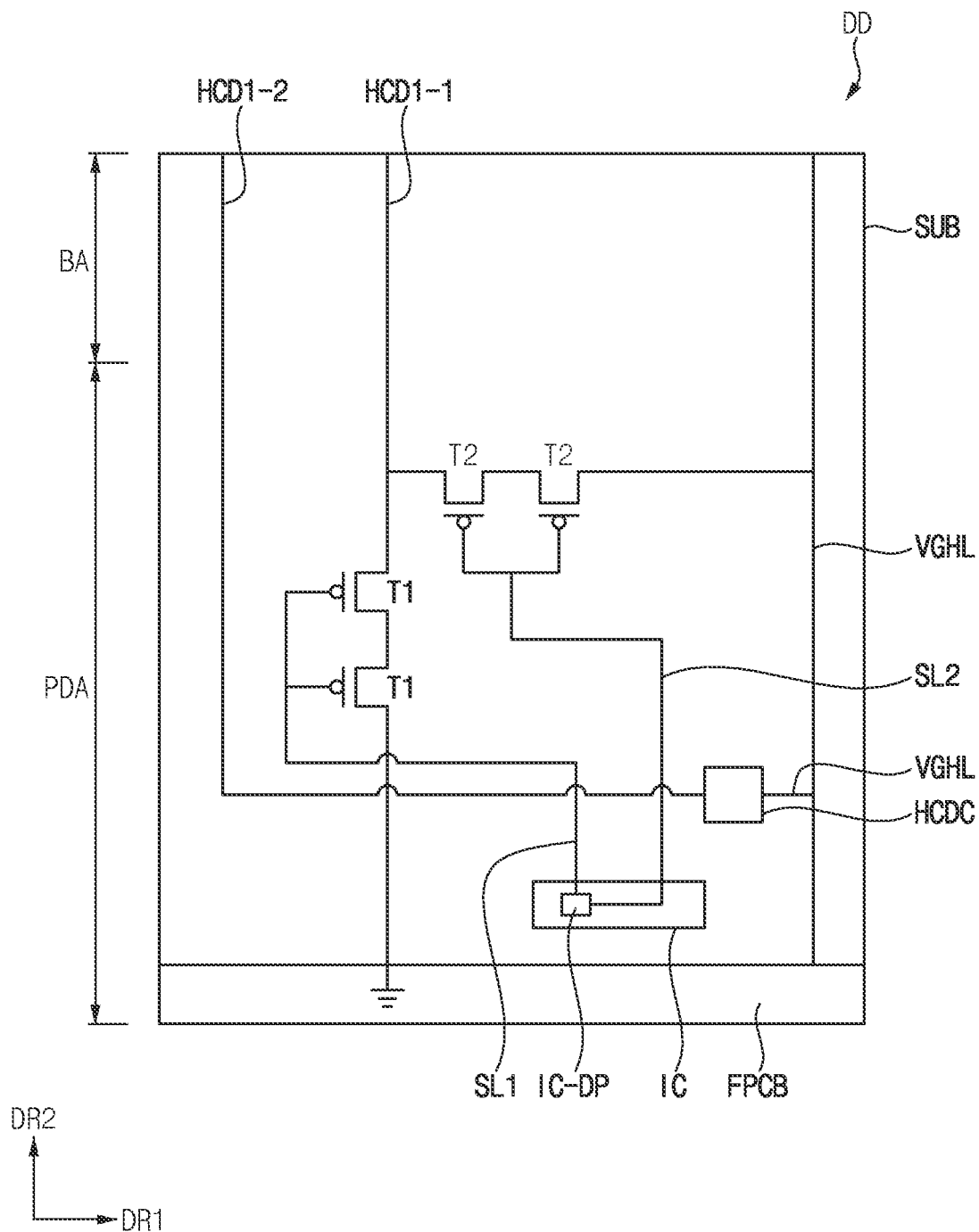
FIG. 8 is a diagram illustrating a circuit structure for explaining a normal mode and an inspecting mode of the display device of FIG. 1.

FIG. 8 is a diagram illustrating a circuit structure for explaining a normal mode and an inspecting mode of the display device of FIG. 1.

Referring to FIGS. 1 and 8, the display device DD according to an embodiment of the present disclosure may include the substrate SUB, the plurality of pixels PX, the first crack detection line HCD1, the driving chip IC, the printed circuit board FPCB, and the crack detection circuit HCDC. Hereinafter, descriptions overlapping with descriptions of the crack detection circuit HCDC described with reference to FIG. 3 will be omitted or simplified.

The first crack detection line HCD1 may include the first part HCD1-1 and the second part HCD1-2. The first part HCD1-1 of the first crack detection line HCD1 may be disposed on the substrate SUB in the pad area PDA and may extend to the bending area BA and the peripheral area PA. One end of the second part HCD1-2 of the first crack detection line HCD1 may be connected to the first part HCD1-1 of the first crack detection line HCD1. The second part HCD1-2 of the first crack detection line HCD1 may be disposed to surround the periphery of the hole area HA and may extend to the bending area BA and the pad area PDA. The other end of the second part HCD1-2 of the first crack detection line HCD1 may be connected to the crack detection circuit HCDC.

The display device DD according to an embodiment of the present disclosure may further include the constant voltage line VGHL, a first signal line SL1, a second signal line SL2, a plurality of first transistors T1, and a plurality of second transistors T2.

The constant voltage line VGHL may be connected to the printed circuit board FPCB and the crack detection circuit HCDC. The printed circuit board FPCB may provide a constant voltage to the constant voltage line VGHL.

The first signal line SL1 may be connected to the driving chip IC. Specifically, the first signal line SL1 may be connected to a driving dummy pad IC-DP included in the driving chip IC. The driving chip IC may provide a first signal to the first signal line SL1.

The second signal line SL2 may be connected to the driving chip IC. Specifically, the second signal line SL2 may be connected to the driving dummy pad IC-DP included in the driving chip IC. The driving chip IC may provide a second signal to the second signal line SL2.

The plurality of the first transistors T1 may be disposed on the substrate SUB in the pad area PDA. And the first transistors T1 may be connected in series between the printed circuit board FPCB and the first part HCD1-1 of the first crack detection line HCD1. In an embodiment, the first transistors T1 may be connected to a ground of the printed circuit board FPCB. Each of gate electrodes of the first transistors T1 may be connected to the first signal line SL1. The first signal may be applied to each of the gate electrodes of the first transistors T1 through the first signal line SL1.

The plurality of the second transistors T2 may be disposed on the substrate SUB in the pad area PDA. And the second transistors T2 may be connected in series between the constant voltage line VGHL and the first part HCD1-1 of the first crack detection line HCD1. Each of gate electrodes of the second transistors T2 may be connected to the second signal line SL2. The second signal may be applied to each of the gate electrodes of the second transistors T2 through the second signal line SL2.

However, although each of the first transistors T1 and the second transistors T2 of the present disclosure is described as having a configuration in which two transistors are connected in series, the configuration of the present disclosure is not limited thereto. In other embodiments, each of the first transistors T1 and the second transistors T2 may have a configuration in which three or more transistors are connected in series.

The display device DD may be driven in the normal mode, which is a mode generally used by the user, or the inspection mode in which crack of the hole formed in the hole area HA are inspected. Hereinafter, the normal mode and the inspection mode will be described.

When the display device DD is driven in the normal mode, the first transistors T1 may be turned on by a first signal provided through the first signal line SL1 and the second transistors T2 may be turned off by a second signal provided through the second signal line SL2. In this case, the first signal may have a low level and the second signal may have a high level. That is, each of the first transistors T1 and the second transistors T2 may be PMOS transistors. Accordingly, when the display device DD is driven in the normal mode, a ground voltage may be applied to the first part HCD1-1 of the first crack detection line HCD1 through the printed circuit board FPCB.

When the display device DD is driven in the inspection mode, the first transistors T1 may be turned off by a first signal provided through the first signal line SL1 and the second transistors T2 may be turned on by a second signal provided through the second signal line SL2. In this case, the first signal may have a high level and the second signal may have a low level. Accordingly, when the display device DD is driven in the inspection mode, the constant voltage may be applied to the first part HCD1-1 of the first crack detection line HCD1 through the constant voltage line VGHL.

When the display device is driven in the normal mode, which is a mode generally used by the user, the constant voltage (e.g., high voltage) may be applied to the first crack detection line HCD1. In this case, as iodine (I) of a polarization member (e.g., the polarization member of FIG. 4) is eluted into the first crack detection line HCD1 in a high temperature and high humidity environment and a general user environment, corrosion of the first crack detection line HCD1 may occur. In addition, corrosion of driving signal lines adjacent to the first crack detection line HCD1 may occur due to corrosion of the first crack detection line HCD1.

To prevent this, in the display device DD according to an embodiment of the present disclosure, when the display device DD is driven in the normal mode, the ground voltage may be applied to the first crack detection line HCD1. Also, when the display device DD is driven in the inspection mode, the constant voltage (e.g., high voltage) may be applied to the first crack detection line HCD1. Accordingly, failure of the first crack detection line HCD1 due to corrosion that may occur when driving for a long time in a high temperature and high humidity environment and the general user environment may be effectively improved. In addition, failure of the driving signal lines positioned adjacent to the first crack detection line HCD1 caused by corrosion of the first crack detection line HCD1 may be effectively improved.

Also, the display device DD according to an embodiment of the present disclosure may include the plurality of first transistors T1 connected in series and the plurality of second transistors T2 connected in series. In this case, when the display device DD is driven in the normal mode, leakage current generated in the transistors T1 and T2 may be reduced.

Figure 9:
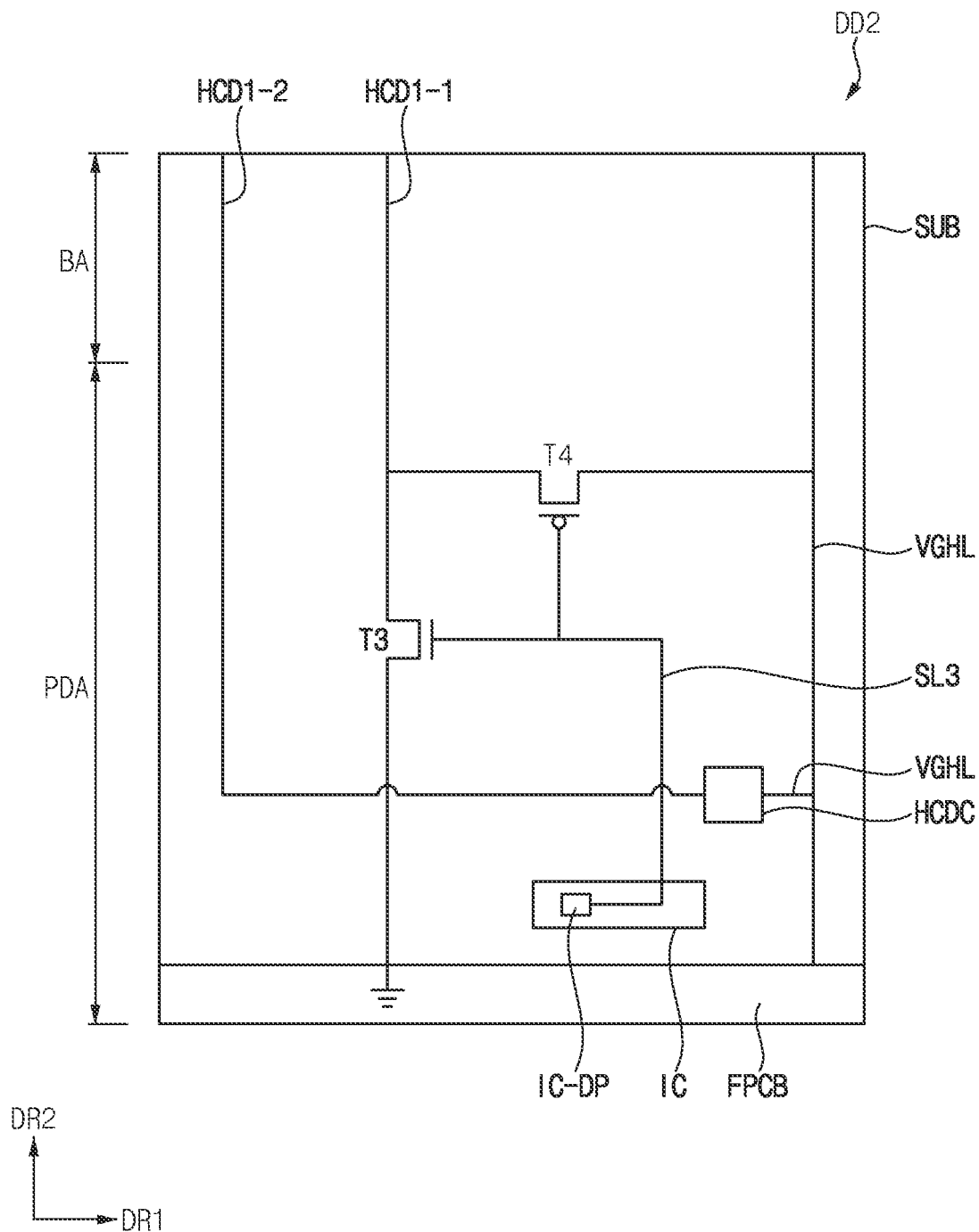
FIGS. 9 and 10 are diagrams illustrating a circuit structure for explaining a normal mode and an inspecting mode of a display device according to another embodiment.
Figure 10:
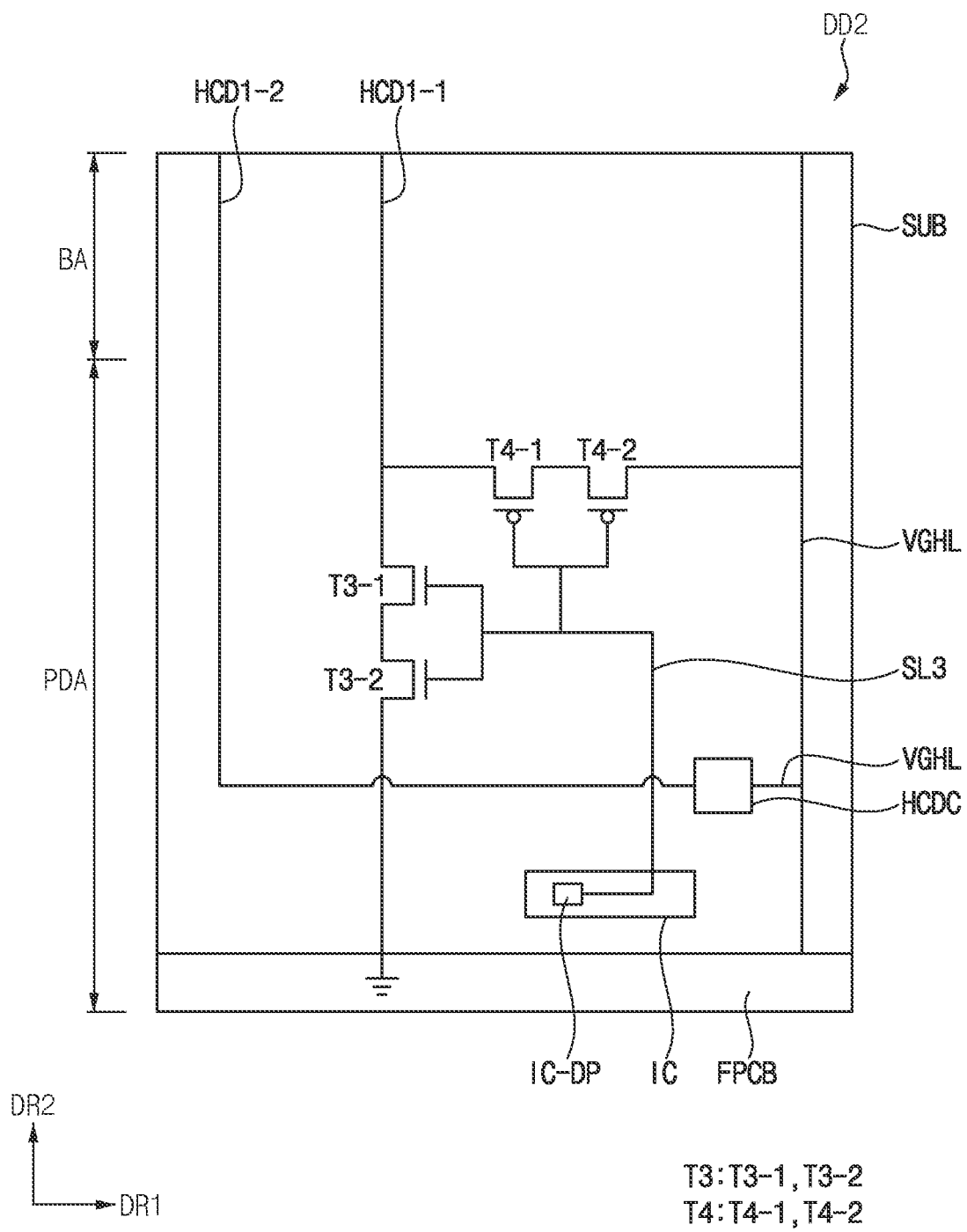

FIGS. 9 and 10 are diagrams illustrating a circuit structure for explaining a normal mode and an inspecting mode of a display device according to another embodiment.

Referring to FIG. 9, a display device DD2 according to another embodiment of the present disclosure may include the substrate SUB, the first crack detection line HCD1, the driving chip IC, the printed circuit board FPCB, and the crack detection circuit HCDC. Hereinafter, descriptions overlapping with descriptions of the crack detection circuit HCDC described with reference to FIG. 3 will be omitted or simplified. Also, descriptions overlapping with the circuit structure of the display device DD described with reference to FIG. 8 will be omitted or simplified.

The first crack detection line HCD1 may include the first part HCD1-1 and the second part HCD1-2. One end of the second part HCD1-2 of the first crack detection line HCD1 may be connected to the first part HCD1-1 of the first crack detection line HCD1. In addition, the other end of the second part HCD1-2 of the first crack detection line HCD1 may be connected to the crack detection circuit HCDC.

The display device DD2 according to another embodiment of the present disclosure may further include the constant voltage line VGHL, a third signal line SL3, a third transistor T3, and a fourth transistor T4.

The constant voltage line VGHL may be connected to the printed circuit board FPCB and the crack detection circuit HCDC. The printed circuit board FPCB may provide a constant voltage to the constant voltage line VGHL.

The third signal line SL3 may be connected to the driving chip IC. Specifically, the third signal line SL3 may be connected to the driving dummy pad IC-DP included in the driving chip IC. The driving chip IC may provide a third signal to the third signal line SL3.

The third transistor T3 may be disposed on the substrate SUB in the pad area PDA. The third transistor T3 may include a first electrode, a second electrode, and a gate electrode. The first electrode of the third transistor T3 may be connected to the printed circuit board FPCB. In an embodiment, the first electrode of the third transistor T3 may be connected to the ground of the printed circuit board FPCB. The second electrode of the third transistor T3 may be connected to the first part HCD1-1 of the first crack detection line HCD1. The gate electrode of the third transistor T3 may be connected to the third signal line SL3. The third signal may be applied to the gate electrode of the third transistor T3 through the third signal line SL3.

The fourth transistor T4 may be disposed on the substrate SUB in the pad area PDA. The fourth transistor T4 may include a first electrode, a second electrode, and a gate electrode. The first electrode of the fourth transistor T4 may be connected to the constant voltage line VGHL. The second electrode of the fourth transistor T4 may be connected to the first part HCD1-1 of the first crack detection line HCD1. The gate electrode of the fourth transistor T4 may be connected to the third signal line SL3. The third signal may be applied to the gate electrode of the fourth transistor T4 through the third signal line SL3.

In an embodiment, the gate electrode of the third transistor T3 and the gate electrode of the fourth transistor T4 may be connected to each other. That is, each of the third transistor T3 and the fourth transistor T4 may be turned on or turned off by one signal line.

Referring further to FIG. 10, in another embodiment, the third transistor T3 may include a (3-1)-th transistor T3-1 and a (3-2)-th transistor T3-2. And the (3-1)-th transistor T3-1 and the (3-2)-th transistor T3-2 may be connected in series with each other. In addition, the fourth transistor T4 may include a (4-1)-th transistor T4-1 and a (4-2)-th transistor T4-2. And the (4-1)-th transistor T4-1 and the (4-2)-th transistor T4-2 may be connected in series with each other. In this case, although each of the third transistor T3 and the fourth transistor T4 of the present disclosure is described as having a configuration in which two transistors are connected in series, the configuration of the present disclosure is not limited thereto. In other embodiments, each of the third transistor T3 and the fourth transistor T4 may have a configuration in which three or more transistors are connected in series.

When the display device DD2 is driven in the normal mode, the third transistor T3 may be turned on by a third signal provided through the third signal line SL3 and the fourth transistor T4 may be turned off by the third signal provided through the third signal line SL3. In this case, the third signal may have a high level. That is, the third transistor T3 may be an NMOS transistor, and the fourth transistor T4 may be a PMOS transistor.

Accordingly, when the display device DD2 is driven in the normal mode, a ground voltage may be applied to the first part HCD1-1 of the first crack detection line HCD1 through the printed circuit board FPCB.

When the display device DD2 is driven in the inspection mode, the third transistor T3 may be turned off by a third signal provided through the third signal line SL3 and the fourth transistor T4 may be turned on by the third signal provided through the third signal line SL3. In this case, the third signal may have a low level.

Accordingly, when the display device DD2 is driven in the inspection mode, the constant voltage may be applied to the first part HCD1-1 of the first crack detection line HCD1 through the constant voltage line VGHL.

Figure 11:
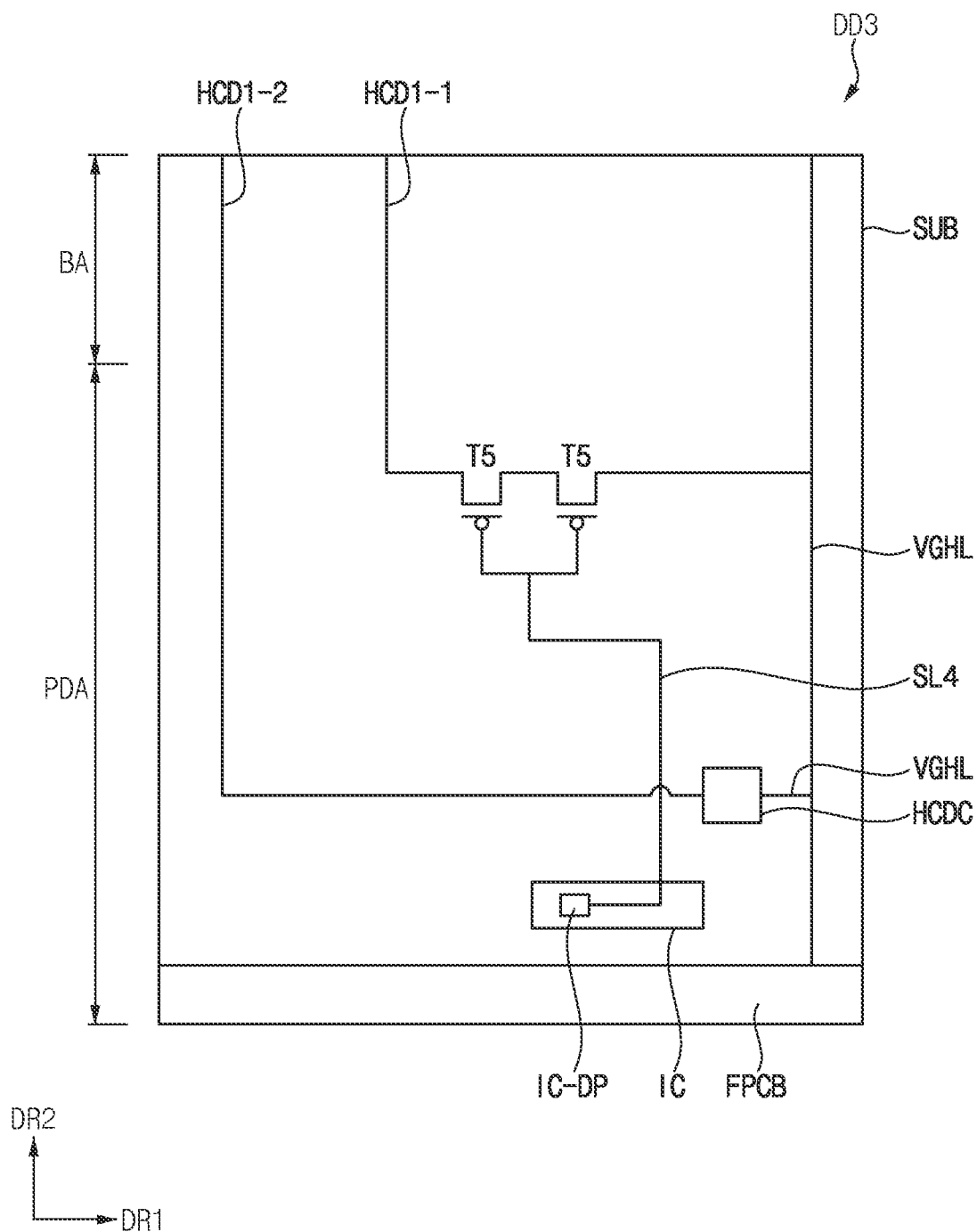
FIG. 11 is a diagram illustrating a circuit structure for explaining a normal mode and an inspecting mode of a display device according to still another embodiment.

FIG. 11 is a diagram illustrating a circuit structure for explaining a normal mode and an inspecting mode of a display device according to still another embodiment.

Referring to FIG. 11, a display device DD3 according to still another embodiment of the present disclosure may include the substrate SUB, the first crack detection line HCD1, the driving chip IC, the printed circuit board FPCB, and the crack detection circuit HCDC. Hereinafter, descriptions overlapping with descriptions of the crack detection circuit HCDC described with reference to FIG. 3 will be omitted or simplified. Also, descriptions overlapping with the circuit structure of the display device DD described with reference to FIG. 8 will be omitted or simplified.

The first crack detection line HCD1 may include the first part HCD1-1 and the second part HCD1-2. One end of the second part HCD1-2 of the first crack detection line HCD1 may be connected to the first part HCD1-1 of the first crack detection line HCD1. In addition, the other end of the second part HCD1-2 of the first crack detection line HCD1 may be connected to the crack detection circuit HCDC.

The display device DD3 according to still another embodiment of the present disclosure may further include the constant voltage line VGHL, a fourth signal line SL4, and a plurality of fifth transistors T5.

The constant voltage line VGHL may be connected to the printed circuit board FPCB and the crack detection circuit HCDC. The printed circuit board FPCB may provide a constant voltage to the constant voltage line VGHL.

The fourth signal line SL4 may be connected to the driving chip IC. Specifically, the fourth signal line SL4 may be connected to the driving dummy pad IC-DP included in the driving chip IC. The driving chip IC may provide a fourth signal to the fourth signal line SL4.

The plurality of fifth transistors T5 are disposed on the substrate SUB in the pad area PDA. And the fifth transistors T5 may be connected in series between the constant voltage line VGHL and the first part HCD1-1 of the first crack detection line HCD1. Each of gate electrodes of the fifth transistors T5 may be connected to the fourth signal line SL4. The fourth signal may be applied to each of the gate electrodes of the fifth transistors T5 through the fourth signal line SL4.

Although the fifth transistors T5 of the present disclosure are described as having a configuration in which two transistors are connected in series, the configuration of the present disclosure is not limited thereto. In other embodiments, the fifth transistors T5 may have a configuration in which three or more transistors are connected in series.

When the display device DD3 is driven in the normal mode, the fifth transistors T5 may be turned off by a fourth signal provided through the fourth signal line SL4. In this case, the fourth signal may have a high level. That is, the fifth transistors T5 may be PMOS transistors. Accordingly, when the display device DD3 is driven in the normal mode, the first part HCD1-1 and the second part HCD1-2 of the first crack detection line HCD1 may be in a floating state.

When the display device DD3 is driven in the inspection mode, the fifth transistors T5 may be turned on by a fourth signal provided through the fourth signal line SL4. In this case, the fourth signal may have a low level. Accordingly, when the display device DD3 is driven in the inspection mode, the constant voltage may be applied to the first part HCD1-1 of the first crack detection line HCD1 through the constant voltage line VGHL.

The present disclosure can be applied to various display devices. In an embodiment, for example, the present disclosure can be applied to various display devices such as display devices for vehicles, ships and aircraft, portable communication devices, display devices for exhibition or information transmission, medical display devices and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
   a substrate comprising a display area on which a plurality of pixels are disposed, a peripheral area surrounding the display area, a hole area positioned inside the display area, a pad area, and a bending area positioned between the peripheral area and the pad area in a plan view;
   a crack detection line comprising a first part disposed on the substrate in the pad area and extending to the bending area and the peripheral area and a second part connected to the first part, disposed to surround the hole area, and extending to the peripheral area, the bending area and the pad area;
   a printed circuit board disposed on the substrate in the pad area;
   a plurality of first transistors disposed on the substrate in the pad area and connected in series between the printed circuit board and the first part of the crack detection line, wherein each of gate electrodes of the first transistors is connected to a first signal line to receive a first signal; and
   a plurality of second transistors disposed on the substrate in the pad area and connected in series between a constant voltage line for applying a constant voltage and the first part of the crack detection line, wherein each of gate electrodes of the second transistors is connected to a second signal line to receive a second signal.

2. The display device of claim 1, further comprising:
a driving chip disposed on the substrate in the pad area, wherein the driving chip is connected to each of the first signal line and the second signal line, configured to provide the first signal to the first signal line, and configured to provide the second signal to the second signal line.

3. The display device of claim 1, wherein when the display device is driven in an inspection mode,
the first signal having a high level is applied to each of the gate electrodes of the first transistors through the first signal line such that each of the first transistors is turned off, and
the second signal having a low level is applied to each of the gate electrodes of the second transistors through the second signal line such that each of the second transistors is turned on.

4. The display device of claim 3, wherein when the display device is driven in the inspection mode, the constant voltage is applied to the first part of the crack detection line through the constant voltage line.

5. The display device of claim 1, wherein when the display device is driven in a normal mode,
the first signal having a low level is applied to each of the gate electrodes of the first transistors through the first signal line such that each of the first transistors is turned on, and
the second signal having a high level is applied to each of the gate electrodes of the second transistors through the second signal line such that each of the second transistors is turned off.

6. The display device of claim 5, wherein the first transistors are connected to a ground of the printed circuit board and
when the display device is driven in the normal mode, a ground voltage is applied to the first part of the crack detection line through the printed circuit board.

7. The display device of claim 1, further comprising:
a semiconductor element comprising an active layer disposed on the substrate in the display area, a gate electrode overlapping a channel area of the active layer in the plan view, a source electrode connected to a source area of the active layer, and a drain electrode connected to a drain area of the active layer;
a connection electrode disposed on the semiconductor element and connected to the semiconductor element; and
a touch sensing structure comprising a sensing connection pattern disposed on the semiconductor element and a sensing electrode pattern disposed on the sensing connection pattern.

8. The display device of claim 7, wherein the crack detection line comprises:
a first conductive pattern disposed on the substrate in the pad area;
a second conductive pattern disposed on the substrate in the bending area, extending to a part of the peripheral area and a part of the pad area, and connected to the first conductive pattern; and
a touch conductive pattern disposed on the substrate in the peripheral area and connected to the second conductive pattern.

9. The display device of claim 8, wherein the first conductive pattern is disposed in a same layer as the source electrode and the drain electrode, the second conductive pattern is disposed in a same layer as the connection electrode, and the touch conductive pattern is disposed in a same layer as the sensing electrode pattern.

10. A display device comprising:
a substrate comprising a display area on which a plurality of pixels are disposed, a peripheral area surrounding the display area, a hole area positioned inside the display area, a pad area, and a bending area positioned between the peripheral area and the pad area in a plan view;
a crack detection line comprising a first part disposed on the substrate in the pad area and extending to the bending area and the peripheral area and a second part connected to the first part, disposed to surround the hole area, and extending to the peripheral area, the bending area and the pad area;
a printed circuit board disposed on the substrate in the pad area;
a first transistor disposed on the substrate in the pad area, wherein a gate electrode of the first transistor is connected to a signal line to receive a signal, a first electrode of the first transistor is connected to the printed circuit board, and a second electrode of the first transistor is connected to the first part of the crack detection line; and
a second transistor disposed on the substrate in the pad area, wherein a gate electrode of the second transistor is connected to the signal line to receive the signal, a first electrode of the second transistor is connected to a constant voltage line for applying a constant voltage, and a second electrode of the second transistor is connected to the first part of the crack detection line.

11. The display device of claim 10, further comprising:
a driving chip disposed on the substrate in the pad area, wherein the driving chip is connected to the signal line and configured to provide the signal to the signal line.

12. The display device of claim 11, wherein the gate electrode of the first transistor and the gate electrode of the second transistor are connected to each other.

13. The display device of claim 12, wherein the first transistor comprises a (1-1)-th transistor and a (1-2)-th transistor,
the (1-1)-th transistor and the (1-2)-th transistor are connected in series with each other,
the second transistor comprises a (2-1)-th transistor and a (2-2)-th transistor, and
the (2-1)-th transistor and the (2-2)-th transistor are connected in series with each other.

14. The display device of claim 12, wherein when the display device is driven in an inspection mode,
the signal having a low level is applied to the gate electrode of the first transistor through the signal line such that the first transistor is turned off, and
the signal having the low level is applied to the gate electrode of the second transistor through the signal line such that the second transistor is turned on.

15. The display device of claim 14, wherein when the display device is driven in the inspection mode, the constant voltage is applied to the first part of the crack detection line through the constant voltage line.

16. The display device of claim 12, wherein when the display device is driven in a normal mode, the signal having a high level is applied to the gate electrode of the first transistor through the signal line such that the first transistor is turned on, and the signal having the high level is applied to the gate electrode of the second transistor through the signal line such that the second transistor is turned off.

17. The display device of claim 16, wherein the first electrode of the first transistor is connected to a ground of the printed circuit board and when the display device is driven in the normal mode, a ground voltage is applied to the first part of the crack detection line through the printed circuit board.

18. A display device comprising:

a substrate comprising a display area on which a plurality of pixels are disposed, a peripheral area surrounding the display area, a hole area positioned inside the display area, a pad area, and a bending area positioned between the peripheral area and the pad area in a plan view;

a crack detection line comprising a first part disposed on the substrate in the pad area and extending to the bending area and the peripheral area and a second part connected to the first part, disposed to surround the hole area, and extending to the peripheral area, the bending area and the pad area;

a driving chip disposed on the substrate in the pad area and connected to a signal line to provide a signal to the signal line; and a plurality of transistors disposed on the substrate in the pad area and connected in series between a constant voltage line for applying a constant voltage and the first part of the crack detection line, wherein each of gate electrodes of the transistors is connected to the signal line to receive the signal.

19. The display device of claim 18, wherein when the display device is driven in an inspection mode, the signal having a low level is applied to each of the gate electrodes of the transistors through the signal line such that each of the transistors is turned on, and the constant voltage is applied to the first part of the crack detection line through the constant voltage line.

20. The display device of claim 18, wherein when the display device is driven in a normal mode, the signal having a high level is applied to each of the gate electrodes of the transistors through the signal line such that each of the transistors is turned off, and the crack detection line is in a floating state.

\* \* \* \* \*